(12) United States Patent
Lai

(10) Patent No.: US 12,147,157 B2
(45) Date of Patent: Nov. 19, 2024

(54) PHOTOMASK AND MANUFACTURING METHOD OF SEMICONDUCTOR DEVICE

(71) Applicant: Powerchip Semiconductor Manufacturing Corporation, Hsinchu (TW)

(72) Inventor: Yi-Kai Lai, Taoyuan (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 18/297,634

(22) Filed: Apr. 9, 2023

(65) Prior Publication Data

US 2024/0295808 A1    Sep. 5, 2024

(30) Foreign Application Priority Data

Mar. 3, 2023 (TW) ................................ 112107796

(51) Int. Cl.
*G03F 1/36* (2012.01)
*G03F 7/00* (2006.01)

(52) U.S. Cl.
CPC ............ *G03F 1/36* (2013.01); *G03F 7/70191* (2013.01)

(58) Field of Classification Search
CPC .................... G03F 1/36; G03F 7/70191
See application file for complete search history.

(56) References Cited

U.S. PATENT DOCUMENTS

| 7,463,367 B2 * | 12/2008 | Bowes ................ G03F 7/70641 |
| | | 430/30 |
| 7,569,310 B2 | 8/2009 | Wallace et al. |
| 7,790,357 B2 * | 9/2010 | Jung ..................... G03F 7/0035 |
| | | 430/394 |
| 8,715,891 B2 | 5/2014 | Higaki |
| 9,953,126 B2 * | 4/2018 | Kodama ............. H01L 21/0337 |
| 10,170,309 B2 * | 1/2019 | Dechene ............. H01L 21/0334 |
| 10,274,817 B2 | 4/2019 | Lai et al. |
| 2009/0029267 A1 * | 1/2009 | Cho ......................... G03F 1/36 |
| | | 430/5 |

FOREIGN PATENT DOCUMENTS

| CN | 115524917 | 12/2022 |
| TW | 689517 | 6/2004 |
| TW | 200519526 | 6/2005 |

OTHER PUBLICATIONS

"Office Action of Taiwan Counterpart Application", issued on Sep. 20, 2023, p. 1-p. 8.

* cited by examiner

*Primary Examiner* — Hung V Nguyen
(74) *Attorney, Agent, or Firm* — JCIPRNET

(57) ABSTRACT

A photomask includes a plurality of main patterns, a plurality of first sub-resolution assist feature patterns and a plurality of second sub-resolution assist feature patterns. The first sub-resolution assist feature patterns are located aside the main patterns. The second sub-resolution assist feature patterns are disposed between and connected to adjacent two of the first sub-resolution assist feature patterns.

10 Claims, 4 Drawing Sheets

PHOTOMASK AND MANUFACTURING METHOD OF SEMICONDUCTOR DEVICE

CROSS-REFERENCE TO RELATED APPLICATION

This application claims the priority benefit of Taiwan application serial no. 112107796, filed on Mar. 3, 2023. The entirety of the above-mentioned patent application is hereby incorporated by reference herein and made a part of this specification.

BACKGROUND

Technical Field

The present disclosure relates to a mask and a method of manufacturing a device, and particularly relates to a photomask and a method of manufacturing a semiconductor device.

Description of Related Art

The semiconductor integrated circuit (IC) industry has experienced rapid growth, and one of the most important steps in the entire semiconductor process is a photolithography process. In the lithography process, a photoresist layer on a wafer is irradiated by an exposure apparatus, so as to transfer the photomask pattern to the photoresist layer on the wafer.

In the advanced semiconductor processes, sub-resolution assist features (SRAF) are important in the lithography process for increasing the process window in an isolated region. However, the sub-resolution assist features of the photomask often remain unexpectedly on the substrate, affecting the performance of the semiconductor device. Therefore, there is a need for an improved photomask and a method of manufacturing a semiconductor device using the photomask.

SUMMARY

The present disclosure provides a photomask, with which a better process window in an isolated feature region is obtained. Moreover, in the method of manufacturing a semiconductor device by using the photomask of the present disclosure, the sub-resolution assist features of the photomask do not remain on the substrate to affect the performance of the semiconductor device.

The present disclosure provides a photomask, which includes a main pattern, a plurality of first sub-resolution patterns and a plurality of second sub-resolution patterns. The first sub-resolution patterns are located aside the main patterns. The second sub-resolution patterns are located between and connected to adjacent two of the first sub-resolution patterns.

In an embodiment of the present disclosure, an extension direction of the first sub-resolution patterns is perpendicular to an illumination polar axis direction of an exposure apparatus, and an extension direction of the second sub-resolution patterns is parallel to the illumination polar axis direction of the exposure apparatus.

In an embodiment of the present disclosure, the main patterns extend along a first direction, the first sub-resolution patterns extend along the first direction, and the second sub-resolution patterns extend along a second direction perpendicular to the first direction.

In an embodiment of the present disclosure, a difference between a phase of the first sub-resolution patterns and a phase of the second sub-resolution patterns is 180 degrees.

In an embodiment of the present disclosure, a phase of the main patterns and a phase of the second sub-resolution patterns are both 180 degrees, and a phase of the first sub-resolution patterns is 0 degree.

In an embodiment of the present disclosure, the main patterns, the first sub-resolution patterns and the second sub-resolution patterns have the same transmittance.

In an embodiment of the present disclosure, the second sub-resolution patterns have the same pitch.

In an embodiment of the present disclosure, the second sub-resolution patterns have different pitches.

In an embodiment of the present disclosure, the first sub-resolution patterns are strip patterns parallel to each other and located at two sides of the main patterns, and the second sub-resolution patterns are connected adjacent two of the first sub-resolution patterns.

In an embodiment of the present disclosure, the photomask is suitable for imaging the plurality of main patterns to a plurality of line patterns of a photoresist layer, and the first sub-resolution patterns and the second sub-resolution patterns are not imaged to the photoresist layer.

The present disclosure further provides a method of manufacturing a semiconductor device which includes the following steps. A photoresist layer is formed on a substrate. The photoresist layer on the substrate is exposed with an exposure apparatus and a photomask, wherein the photomask includes a plurality of main patterns; a plurality of first sub-resolution patterns disposed aside the plurality of main patterns; and a plurality of second sub-resolution patterns disposed aside the plurality of main patterns and bridging adjacent first sub-resolution patterns.

In an embodiment of the present disclosure, the main patterns of the photomask is imaged to the photoresist layer, while the first sub-resolution patterns and the second sub-resolution patterns of the photomask are not imaged to the photoresist layer.

In an embodiment of the present disclosure, an extension direction of the first sub-resolution patterns is perpendicular to an illumination polar axis direction of the exposure apparatus, and an extension direction of the second sub-resolution patterns is parallel to the illumination polar axis direction of the exposure apparatus.

In an embodiment of the present disclosure, the main patterns extend along a first direction, the first sub-resolution patterns extend along the first direction, and the second sub-resolution patterns extend along a second direction perpendicular to the first direction.

In an embodiment of the present disclosure, a different between a phase of the first sub-resolution patterns and a phase of the second sub-resolution patterns is 180 degrees.

In an embodiment of the present disclosure, a phase of the main patterns and a phase of the second sub-resolution patterns are both 180 degrees, and a phase of the first sub-resolution patterns is 0 degree.

In an embodiment of the present disclosure, the main patterns, the first sub-resolution patterns, and the second sub-resolution patterns have the same transmittance.

In an embodiment of the present disclosure, the second sub-resolution patterns have the same pitch.

In an embodiment of the present disclosure, the second sub-resolution patterns have different pitches.

In an embodiment of the present disclosure, the method further includes developing the exposed photoresist layer.

Based on the above, the photomask of the present disclosure has two kinds of sub-resolution patterns with an optical phase difference of 180 degrees, and the two kinds of sub-resolution patterns are located perpendicular to each other. Such configuration can not only increase the process window of the outer main patterns adjacent to the isolated feature region, but also avoid photoresist pattern residues caused by unnecessary imaging on the substrate.

DESCRIPTION OF THE EMBODIMENTS

Figure 1:
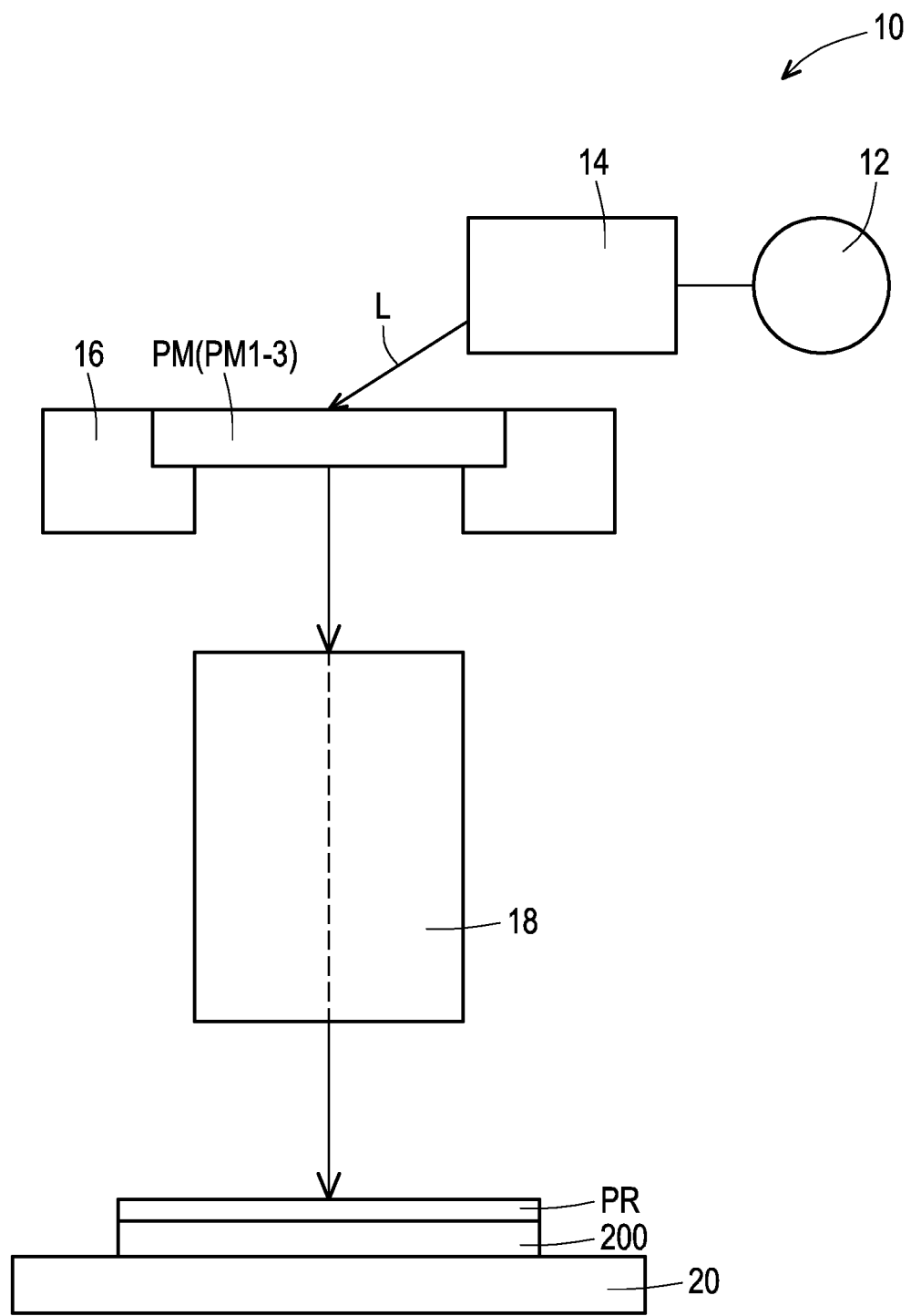
FIG. 1 illustrates a schematic diagram of an exposure apparatus according to an embodiment of the present disclosure.

Some embodiments are listed below and described in detail with the accompanying drawings, but the provided embodiments are not intended to limit the scope of the present disclosure.

For the convenience of understanding, the same or similar elements, film layers, regions or features in the following description will be described with the same or similar reference numerals.

As used herein, the terms "including", "having" and the like used in the disclosure are all open-ended terms, indicating "including but not limited to".

As used herein, the term "substantially" may include an acceptable tolerance range. The tolerance range may be within one or more standard deviations of a value, such as within ±10% or ±5% of the value.

FIG. 1 illustrates a schematic diagram of an exposure apparatus according to an embodiment of the present disclosure.

Referring to FIG. 1, an exposure apparatus 10 includes a light source 12, an illumination element 14, a photomask stage 16, a lens system 18 and a wafer stage 20. The exposure apparatus 10 includes a stepper or a scanner.

The light source 12 is located at one side of the photomask stage 16 for providing an exposure light source. The light source 12 includes G-ray (436 nm), I-ray (365 nm), KrF excimer laser (248 nm), ArF excimer laser (193 nm) or 13.5 nm extreme ultraviolet (EUV), etc.

The illumination element 14 is located between the light source 12 and the photomask stage 16, and includes optical elements (e.g., an aperture stop, an adjuster, and a condenser, etc.) to adjust the radiation beam so as to provide a desired illumination angle, uniformity and intensity distribution in its cross-section. In an embodiment, the illumination element 12 is an off-axis illumination (OAI) element. In an embodiment, the illumination element 12 is a dipole illumination element. After the exposure light source is adjusted by the illumination element 14, the light beam L is emitted towards a reticle or photomask PM. The light source 12 and the illumination element 14 may be collectively referred to as an "illumination system".

The wafer stage 20 can be used to carry a wafer or substrate 200. In an embodiment, the substrate 200 has a material layer and a photoresist layer PR sequentially formed thereon. The photomask stage 16 is located above the wafer stage 20 and configured to support, move and/or rotate the photomask PM to a proper position.

The projection system 18 is located between the wafer stage 20 and the photomask stage 16. Those skilled in the art can select the lens combination in the projection system 18 according to the actual exposure process requirements.

In the lithography process of manufacturing a semiconductor device, a patterned photoresist layer can be formed on a substrate to define subsequent target patterns. The lithography process may include a photoresist coating step, a photoresist exposure step and a photoresist developing step.

The photoresist coating step includes uniformly coating a photoresist layer PR on a substrate 200 with an automated photoresist coating and developing system (not shown), and performing a soft-baking (SB) step. The substrate may include a silicon substrate, and a material layer may be optionally disposed between the photoresist layer and the substrate. The material layer may include a conductive layer, a semiconducting layer or an insulating layer.

The photoresist exposure step includes exposing the photoresist layer with an exposure apparatus (e.g., the exposure apparatus in FIG. 1) through a photomask PM, and performing a post exposure baking (PEB) step. The photomask PM of the present disclosure has the unexpected effect of increasing the process window, which will be described in detail below.

The photoresist developing step includes developing the exposed photoresist layer with the automated photoresist coating and developing system, and thus, a patterned photoresist layer (e.g., a patterned photoresist layer PR1 in FIG. 2) is formed.

In an embodiment, the underlying material layer may be etched by using the patterned photoresist layer as a mask, so as to form the target patterns in the material layer. In another embodiment, the openings of the patterned photoresist layer may be plated with a target material, and the patterned photoresist layer may be removed to obtain the target patterns.

Figure 2:
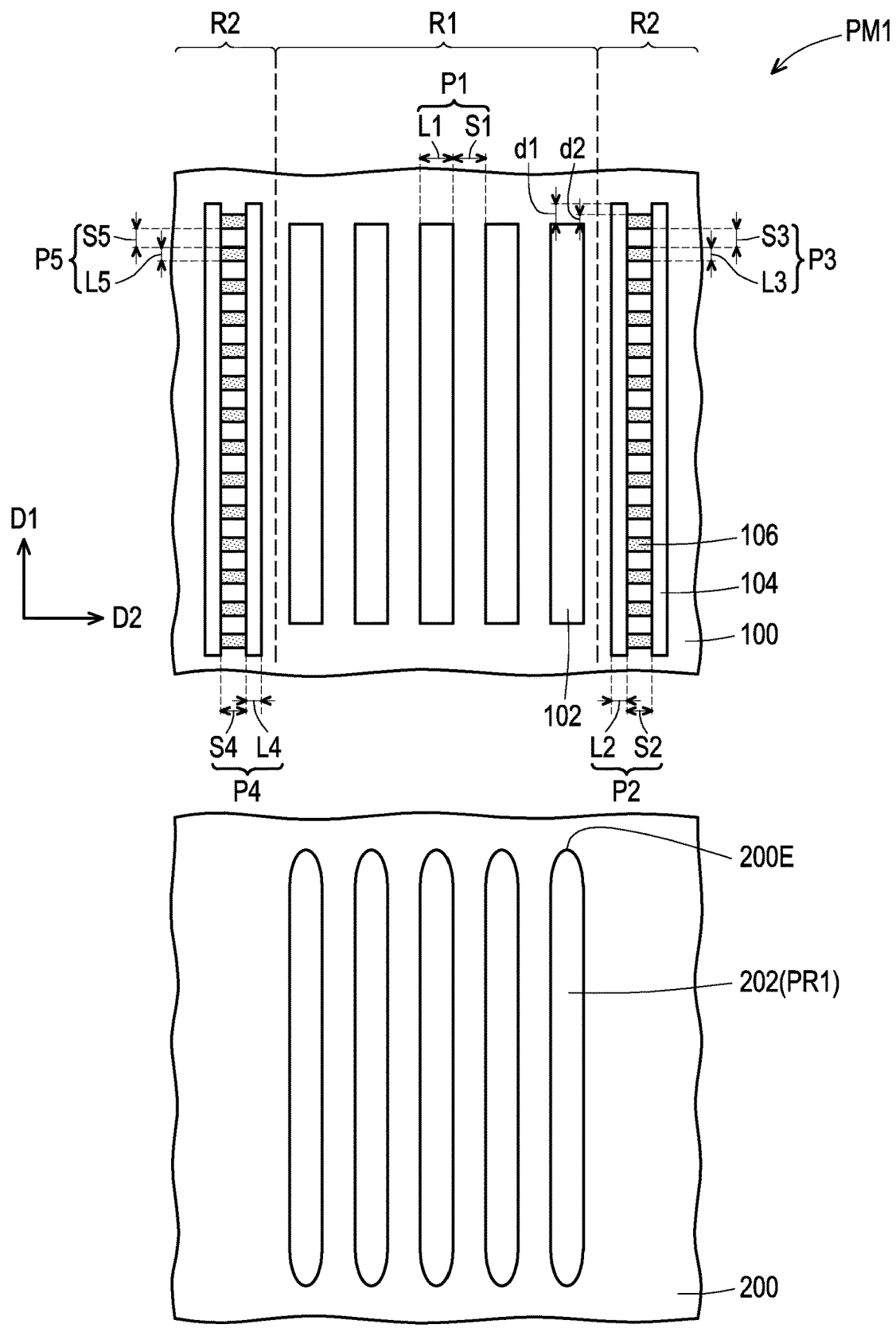
FIG. 2 illustrates schematic partial top views of a photomask and a patterned photoresist layer according to an embodiment of the present disclosure.

FIG. 2 illustrates schematic partial top views of a photomask and a patterned photoresist layer according to an embodiment of the present disclosure. In FIG. 2, the upper part illustrates a schematic diagram of a partial top view of a photomask, and the lower part illustrates a schematic diagram of a partial top view of a patterned photoresist layer. Herein, the figures are provided for the purpose of illustration and easy explanation of the lithography process, and the figures should not be considered as limiting the scope of the present disclosure. Those skilled in the art should understand that the mask pattern size of the photomask may be four times or five times (after exposure and developing steps) the photoresist pattern feature size of the patterned photoresist layer.

Referring to FIG. 2, the photomask PM1 includes a mask substrate 100, a plurality of main patterns 102, a plurality of first sub-resolution patterns 104 and a plurality of second sub-resolution patterns 106. The first and second sub-resolution patterns are referred to as first and second sub-resolution assist patterns (SRAF) in some examples. The photomask PM1 has a dense feature region R1 and an isolated feature region R2. In an embodiment, the isolated feature region R2 is located at two sides of the dense feature region R1. In an embodiment, the isolated feature region R2 surrounds the dense feature region R1. In an embodiment, the main patterns 102 are located in the dense feature region R1, and the first sub-resolution patterns 104 and the second sub-resolution patterns 106 are located in the isolated feature region R2.

The mask substrate 100 has a reference transmittance to exposure light (e.g., ultraviolet-UV beam, or deep ultraviolet-DUV beam) during an exposure process using the photomask PM1. In an embodiment, the mask substrate 100 is a transparent substrate, such as a fused quartz substrate. In an embodiment, the reference transmittance of the mask substrate 100 is 100%, and other transmittances are defined relative to the reference transmittance.

In an embodiment, the main patterns 102, the first sub-resolution patterns 104 and the second sub-resolution patterns 106 have the same transmittance, such as any value between 5% and 90%, such as 6%, 9% or 12%. For example, the transmittance of the main patterns 102 is 6%, the transmittance of the first sub-resolution patterns 104 is 6%, and the transmittance of the second sub-resolution patterns 106 is 6%. However, the present disclosure is not limited thereto. In another embodiment, the main patterns 102, the first sub-resolution patterns 104 and the second sub-resolution patterns 106 may have different transmittances. The transmittances of the main pattern 102, the first sub-resolution patterns 104 and the second sub-resolution patterns 106 are determined depend on their compositions and thicknesses. In an embodiment, the material of each of the main patterns 102, the first sub-resolution patterns 104 and the second sub-resolution patterns 106 includes chromium (Cr), molybdenum silicon (MoSi), zirconia silicon oxide (ZrSiO), silicon nitride (SiN), titanium nitride (TiN), or a combination thereof.

In an embodiment, the main patterns 102 are strip patterns or line patterns arranged parallel to each other and having a line width L1, a line space S1 and a pitch P1, wherein the pitch P1 is the sum of the line width L1 and the line space S1. From a top view, the main patterns 102 extend along a first direction D1.

In an embodiment, the first sub-resolution patterns 104 are strip patterns or line patterns arranged parallel to each other and disposed at two sides of the main patterns 102. In an embodiment, the first sub-resolution patterns 104 at the right side of the main patterns 102 have a line width L2, a line space S2 and a pitch P2, wherein the pitch P2 is the sum of the line width L2 and the line space S2. In an embodiment, the first sub-resolution patterns 104 at the left side of the main patterns 102 have a line width L4, a line space S4 and a pitch P4, wherein the pitch P4 is the sum of the line width L4 and the line space S4. In this embodiment, the line width L2, the line space S2 and/or the pitch P2 are the same as the line width L4, the line space S4 and/or the pitch P4, but the disclosure is not limited thereto. In another embodiment, the line width L2, the line space S2 and/or the pitch P2 are different from the line width L4, the line space S4 and/or the pitch P4. From a top view, the first sub-resolution patterns 104 extend along the first direction D1.

In an embodiment, the second sub-resolution patterns 106 are located between and connected to adjacent two of the first sub-resolution patterns 104. The second sub-resolution patterns 106 are also called "bridging sub-resolution patterns" in some examples. The second sub-resolution patterns 106 extend along a second direction D2 perpendicular to the first direction D1. In an embodiment, the second sub-resolution patterns 106 disposed between two adjacent first sub-resolution patterns 104 at the right side have a line width L3, a line space S3 and a pitch P3, wherein the pitch P3 is sum of the line width L3 and the line space S3. In an embodiment, the second sub-resolution patterns 106 disposed between two adjacent first sub-resolution patterns 104 at the left side have a line width L5, a line space S5 and a pitch P5, wherein the pitch P5 is sum of the line width L5 and the line space S5. In this embodiment, the line width L3, the line space S3 and/or the pitch P3 are the same as the pitch P5, the line width L5, the line space S5 and/or the pitch P5, but the present disclosure is not limited thereto. In another embodiment, the line width L3, the line space S3 and/or the pitch P3 are different from the line width L5, the line space S5 and/or the pitch P5.

In an embodiment, the first sub-resolution patterns 104 protrude from the main patterns 102 by a distance d1, and the second sub-resolution patterns 106 protrude from the main patterns 102 by a distance d2. In an embodiment, as shown in FIG. 2, the distance d1 and the distance d2 are both greater than zero, but the present disclosure is not limited thereto. In another embodiment, the distance d1 and the distance d2 may be substantially zero.

In an embodiment, the line width L2 or L4 of the first sub-resolution patterns 104 may be about ½ to ⅓ times of the line width L1 of the main patterns 102. In an embodiment, the line width L3 or L5 of the second sub-resolution patterns 106 may be about ½ to ⅓ times of the line width L1 of the main patterns 102. In an embodiment, the line width L2 or L4 of the first sub-resolution patterns 104 is the same as the line width L3 or L5 of the second sub-resolution patterns 106. In another embodiment, the line width L2 or L4 of the first sub-resolution patterns 104 may be different (e.g., greater than or less than) the line width L3 or L5 of the second sub-resolution patterns 106.

In an embodiment, the pitch S2 or S4 of the first sub-resolution patterns 104 may be about ⅓ to 2 (e.g., ½ to ⅓ or 1 to 2) times of the pitch S1 of the main patterns 102. In an embodiment, the pitch S3 or S5 of the second sub-resolution patterns 106 may be about ½ to ⅓ times of the pitch S1 of the main patterns 102. In an embodiment, the pitch S2 or S4 of the first sub-resolution patterns 104 may be the same as the pitch S3 or S5 of the second sub-resolution patterns 106. In another embodiment, the line space S2 or S4 of the first sub-resolution patterns 104 may be different (e.g., greater than or less than) the line space S3 or S5 of the second sub-resolution patterns 106.

In an embodiment, the difference between the phase of the first sub-resolution patterns 104 and the phase of the second sub-resolution patterns 106 is 180 degrees. In an embodiment, the difference between the phase of the main patterns 102 and the phase of the first sub-resolution patterns 104 is 180 degrees, and the phase of the main patterns 102 is the same as the phase of the second sub-resolution patterns 106. For example, the phase of the main patterns 102 is 180 degrees, the phase of the first sub-resolution patterns 104 is 0 degree, and the phase of the second sub-resolution patterns 104 is 180 degrees.

In this embodiment, since the first sub-resolution patterns 104 are disposed at two sides of the main patterns 102, the process window of the outermost main patterns 102 adjacent to the isolated feature region R2 can be increased.

In addition, in the present disclosure, the extension direction D1 of the first sub-resolution patterns 104 is perpendicular to the illumination polar axis direction L, the extension direction D2 of the second sub-resolution pattern 106 is parallel to the illumination polar axis direction L, and the difference between the phase of the first sub-resolution patterns 104 and the phase of the second sub-resolution patterns 106 is 180 degrees. With such configuration of the present disclosure, the light passing through the first sub-resolution patterns 104 may be destroyed or eliminated by the light passing through the second sub-resolution patterns 106, so both of the first sub-resolution pattern 104 and the second sub-resolution patterns 106 are not transferred or imaged to the photoresist layer of the substrate.

More specifically, the photomask of the present disclosure has two kinds of sub-resolution patterns with an optical phase difference of 180 degrees, and the two kinds of sub-resolution patterns are located perpendicular to each other. Such configuration can not only increase the process window of the outer main patterns adjacent to the isolated feature region, but also avoid photoresist pattern residues caused by unnecessary imaging on the substrate.

As shown in FIG. 2, after the exposure and developing steps, the main patterns 102 of the photomask PM1 are imaged as stripe patterns 202 of the patterned photoresist layer PR1, while the first sub-resolution patterns 104 and the second sub-resolution patterns 106 of the photomask PM1 are not imaged on the substrate 200. In addition, the strip patterns 202 have tapered end portions 202E, and the outermost strip patterns 202 have substantially the same line width and/or shape as the central strip patterns 202. This means that the outermost stripe patterns 202 have substantially the same process window as that of the central stripe patterns 202.

Figure 3:
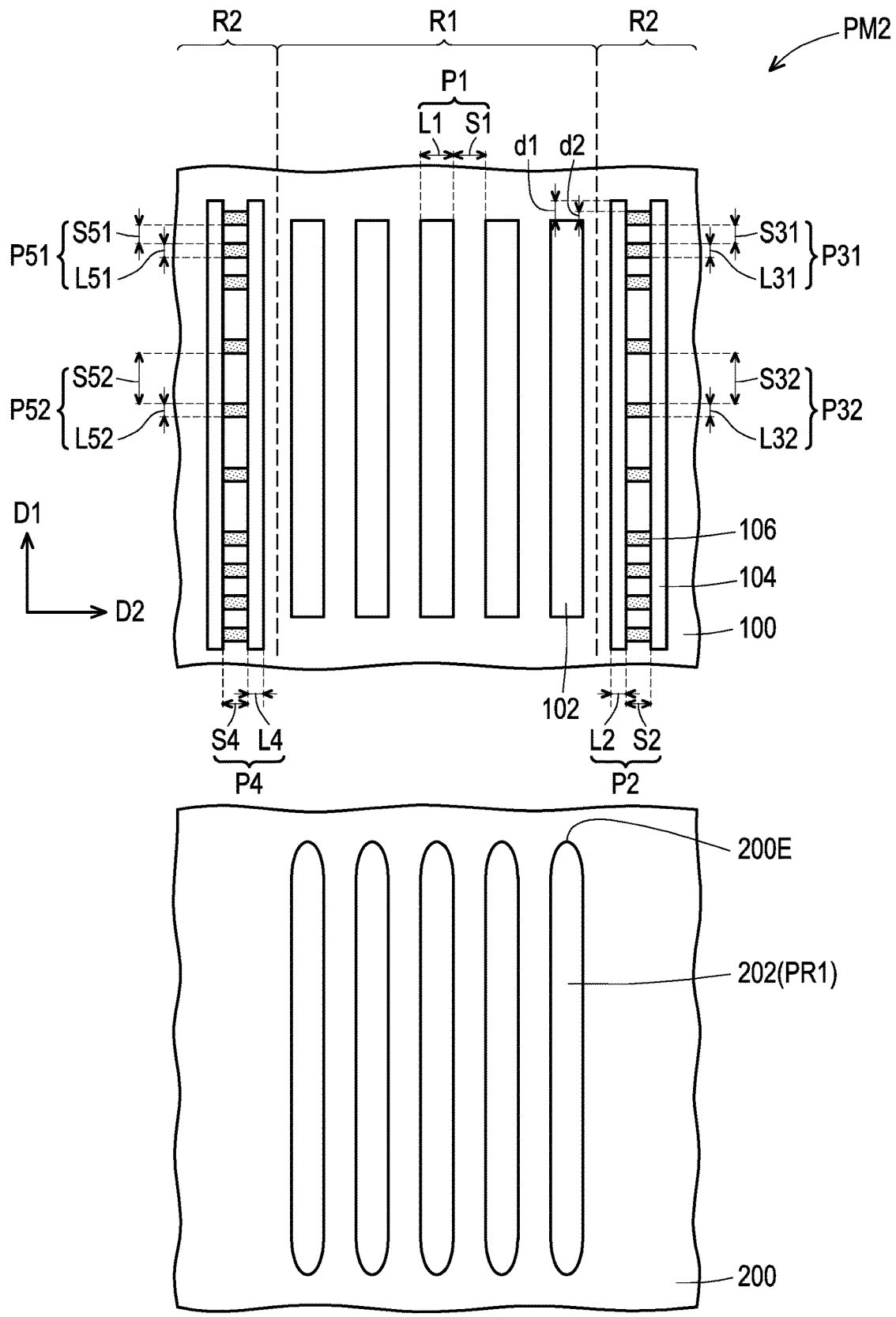
FIG. 3 illustrates schematic partial top views of a photomask and a patterned photoresist layer according to another embodiment of the present disclosure.

In the embodiment of FIG. 2, the second sub-resolution patterns of the photomask PM1 have the same pitch. However, the present disclosure is not limited thereto. In the embodiment of FIG. 3, the second sub-resolution patterns 106 of the photomask PM2 have different pitches.

Referring to FIG. 3, in the photomask PM2, the line width L31, the line space S31 and/or the pitch P31 of the second sub-resolution patterns 106 in an edge area are different from (e.g., less than) the line width L32, the line space S32 and/or pitch P32 of the second sub-resolution patterns 106 in a central area. More specifically, the second sub-resolution patterns 106 are arranged densely with a less line width L31 in the edge area, which is beneficial to improve the process window at the ends of the main patterns 102.

Figure 4:
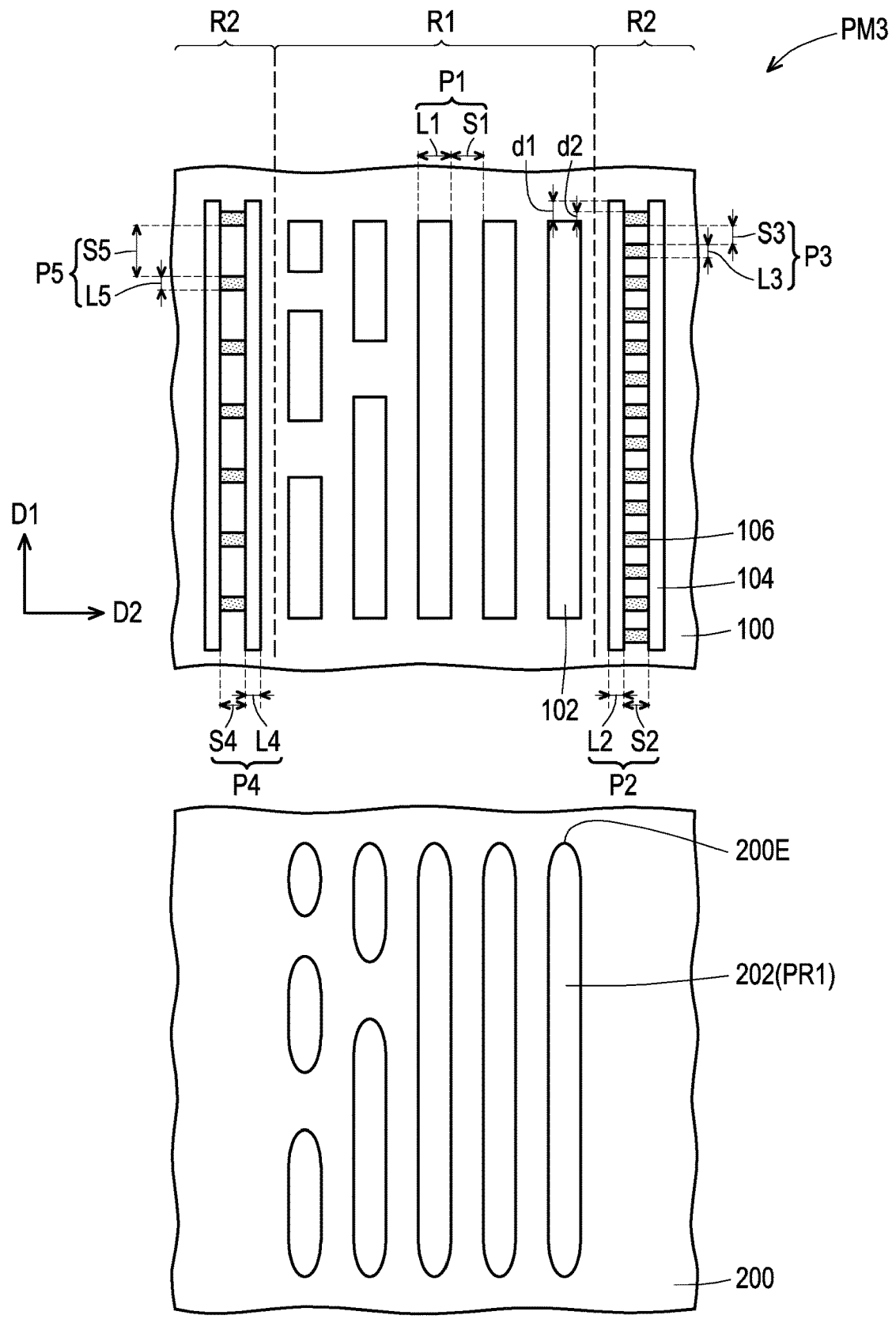
FIG. 4 illustrates schematic partial top views of a photomask and a patterned photoresist layer according to yet another embodiment of the present disclosure.

In the embodiment of FIG. 2, in the photomask PM1, the second sub-resolution patterns 106 at two sides of the main patterns 102 have the same configuration. However, the present disclosure is not limited thereto. In the embodiment of FIG. 4, in the photomask PM3, the second sub-resolution patterns 106 at two sides of the main pattern 102 have different configurations. More specifically, in the photomask PM3, according to the configuration of the main patterns 102, the denser second sub-resolution patterns 106 can be arranged at the outside of the denser main patterns 102 at the right side, and the sparser second sub-resolution patterns 106 can be arranged at the outside of the sparser main patterns 102 at the left side.

The photomasks shown in FIG. 2 to FIG. 4 are only illustrative and not intended to limit the present disclosure. As long as the sub-resolution patterns of the photomask can increase the process window and are not imaged to the substrate, such sub-resolution patterns can be regarded as falling within the spirit and scope of the present disclosure.

In summary, the photomask of the present disclosure has two kinds of sub-resolution patterns with an optical phase difference of 180 degrees, and the two kinds of sub-resolution patterns are located perpendicular to each other. Such configuration can not only increase the process window of the outer main patterns adjacent to the isolated feature region, but also avoid photoresist pattern residues caused by unnecessary imaging on the substrate.

Although the present disclosure has been disclosed above with the embodiments, it is not intended to limit the present disclosure. Anyone with ordinary knowledge in the technical field may make some changes and modifications without departing from the spirit and scope of the present disclosure. The scope of protection of the present disclosure should be defined by the scope of the appended patent application.

What is claimed is:

1. A method of manufacturing a semiconductor device, comprising:
   forming a photoresist layer on a substrate; and
   exposing the photoresist layer on the substrate with an exposure apparatus and a photomask, wherein the photomask comprises:
   a plurality of main patterns;
   a plurality of first sub-resolution patterns disposed aside the plurality of main patterns; and
   a plurality of second sub-resolution patterns disposed aside the plurality of main patterns and bridging adjacent first sub-resolution patterns,
   wherein the first sub-resolution patterns protrude from the main patterns by a first distance, the second sub-resolution patterns protrude from the main patterns by a second distance, and the first distance and the second distance are both greater than zero.

2. The method of claim 1, wherein the main patterns of the photomask is imaged to the photoresist layer, while the first sub-resolution patterns and the second sub-resolution patterns of the photomask are not imaged to the photoresist layer.

3. The method of claim 1, wherein an extension direction of the first sub-resolution patterns is perpendicular to an illumination polar axis direction of the exposure apparatus, and an extension direction of the second sub-resolution patterns is parallel to the illumination polar axis direction of the exposure apparatus.

4. The method of claim 1, wherein the main patterns extend along a first direction, the first sub-resolution patterns extend along the first direction, and the second sub-resolution patterns extend along a second direction perpendicular to the first direction.

5. The method of claim 1, wherein a different between a phase of the first sub-resolution patterns and a phase of the second sub-resolution patterns is 180 degrees.

6. The method of claim 1, wherein a phase of the main patterns and a phase of the second sub-resolution patterns are both 180 degrees, and a phase of the first sub-resolution patterns is 0 degree.

7. The method of claim 1, wherein the main patterns, the first sub-resolution patterns, and the second sub-resolution patterns have the same transmittance.

8. The method of claim 1, wherein the second sub-resolution patterns have the same pitch.

9. The method of claim 1, wherein the second sub-resolution patterns have different pitches.

10. The method of claim 1, further comprising developing the exposed photoresist layer.

* * * * *